United States Patent
Ogihara et al.

(10) Patent No.: US 6,762,437 B2
(45) Date of Patent: Jul. 13, 2004

(54) LIGHT EMITTING SEMICONDUCTOR DEVICE

(75) Inventors: Mitsuhiko Ogihara, Tokyo (JP); Hiroshi Hamano, Tokyo (JP); Masumi Taninaka, Tokyo (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 10/322,740

(22) Filed: Dec. 19, 2002

(65) Prior Publication Data

US 2003/0122135 A1 Jul. 3, 2003

(30) Foreign Application Priority Data

Dec. 20, 2001 (JP) ........................................ 2001-387323

(51) Int. Cl.[7] .............................................. H01L 33/00
(52) U.S. Cl. .......................... 257/94; 257/79; 257/88; 257/101; 372/45; 372/46
(58) Field of Search ............................ 257/79, 88, 94, 257/101; 372/45, 46

(56) References Cited

U.S. PATENT DOCUMENTS

| | | | | |
|---|---|---|---|---|
| 5,189,496 A | * | 2/1993 | Kuwabara ................... 257/79 |
| 5,889,805 A | * | 3/1999 | Botez et al. .................. 372/45 |
| 6,011,811 A | * | 1/2000 | Ohlander et al. ............. 372/46 |
| 6,133,588 A | * | 10/2000 | Ogihara et al. ............... 257/88 |
| 6,180,961 B1 | * | 1/2001 | Ogihara et al. ............... 257/94 |
| 6,222,208 B1 | | 4/2001 | Ogihara et al. |

* cited by examiner

Primary Examiner—David Nelms
Assistant Examiner—Dao H. Nguyen
(74) Attorney, Agent, or Firm—Kenesaka & Takeuchi

(57) ABSTRACT

A light emitting semiconductor device comprises an upper cladding layer (106) consisting of a first upper cladding layer (106a) provided on an active layer (105) and a second upper cladding layer (106b) provided on the first upper cladding layer (106a) to increase the light emitting efficiency and reduce the defective ratio in formation of a patterned layer. The energy band gap (Eg(106a)) of the first upper cladding layer (106a) is larger than the energy band gap (Eg(106b)) of the second upper cladding layer (106b), which is larger than the energy band gap (Eg(105)) of the active layer (105). One of a patterned layer, an dielectric interlayer (109) has an etched region at a predetermined area thereof so that at least a part of the upper cladding layer (106) or a second conductive type semiconductor region (108) is exposed.

14 Claims, 9 Drawing Sheets

LIGHT EMITTING SEMICONDUCTOR DEVICE

BACKGROUND OF THE INVENTION

1. Field of the Invention

This invention relates to a light emitting semiconductor device, such as a light emitting diode array (hereinafter referred to as "LED array"), used as a light source for an electrophotographic printer.

2. Description of the Related Art

A conventional LED array to realize a high light emitting efficiency is discloses, for example, in U.S. Pat. No. 6,222, 208. The LED array comprises an active layer (made of n-type $Al_yGa_{1-y}As$), an upper cladding layer (made of n-type $Al_zGa_{1-z}As$) formed on the active layer, a p-type semiconductor region selectively formed in the upper clad and active layers by diffusing zinc (Zn), and a patterned layer. The patterned layer is defined as an LED surface layer formed on the upper cladding layer and includes a contact semiconductor layer, a dielectric interlayer (or dielectric layers), and an electrode layer (or electrode layers). The contact semiconductor, dielectric, and electrode layers in the patterned layer are partly etched by a photolithography/etching process to make desired patterns.

High light-output efficiency is realized in the LED array for the following reasons. Minority carriers (electrons and holes) are injected into the active layer through a pn-junction interface. Electrons injected into the p-type active layer (Zn-diffused region in the active layer) cannot diffuse out into the p-type upper cladding layer due to the energy barrier formed at the interface between the p-type upper cladding layer (Zn-diffused region in the upper cladding layer) and the p-type active layer. Holes injected into the n-type active layer cannot diffuse out into the n-type lower cladding layer due to the energy barrier formed at the interface between the n-type active layer and the n-type lower cladding layer.

In order to well confine the injected carriers inside the active layer and obtain extremely high light-output efficiency, it is required that an energy band gap of the upper cladding layer is sufficiently large compared to that of the active layer. A large difference in energy band gaps between the active layer and the cladding layer serves high-enough energy barrier for the injected carrier confinement at the interface between the p-type layer and the p-type cladding layer. Therefore, the upper cladding layer is required to have much higher aluminum (Al) content than that of the active layer. That is, a value of z in $Al_zGa_{1-z}As$ is required to be much larger than that of y in $Al_yGa_{1-y}As$.

However, when the content of Al in the upper cladding layer is large (for example, z=0.6), the surface of the upper cladding layer is prone to be etched by an etchant that is used to etch a pn-junction regions formed in the contact layer. The etchant is, for example, a solution consisting of phosphoric acid, hydrogen peroxide, and diluted water. Accordingly, a gap space my be formed in the upper cladding layer by eroding the interface region between the contact layer and the upper cladding layer when the Al content is high in the upper cladding layer and the pn-unction regions formed in the contact layer are etched by wet-etching.

FIG. 14 shows an LED array having gap spaces 321–324 as caused by etchant erosion at the interface between the contact layer and the cladding layer. Reference number 301 denotes a semiconductor substrate, 302 a semiconductor epitaxial layer, 303 a buffer layer, 304 an n-type lower cladding layer, 305 an n-type active layer, 306 an n-type upper cladding layer, 307 an n-type contact layer, 308 a p-type diffusion region, 309 an dielectric interlayer, 310 a p-type contact layer, 311 a p-side electrode (a discrete electrode), and 312 an n-side electrode (a common electrode).

FIGS. 15 and 16 show A1 and A2 sections in FIG. 14, respectively (the discrete electrode 311 is not explicitly drawn in FIGS. 15 and 16). When the gap space 321 or 324 formed at the interface between the upper cladding layer and the contact layer provides a large step or cave-shaped portion near the edge region of an n-type contact layer windows 307b formed by wet-etching the pn-junction regions in the contact layers 307 and 310. Consequently, the dielectric interlayer film and discrete electrode film cannot cover over the step at the n-type contact layer window region. This results in an insulation defect in the dielectric interlayer 309 (FIG. 15) or a disconnection detect in the electrode 311 (FIG. 16).

SUMMARY OF THE INVENTION

Accordingly, it is an object of the present invention to provide a light emitting semiconductor device and its manufacturing method, where one can increase the light emitting efficiency and reduce the defective ratio in the formation of the patterned layer.

In order to achieve the object, a light emitting semiconductor device according to the invention comprises an active layer made of a first conductive type semiconductor epitaxial layer provided on a substrate, an upper cladding layer made of the first conductive type semiconductor epitaxial layer and provided on the active layer, wherein the upper cladding layer comprises a stack of upper cladding sub-layers including a first upper cladding sub-layer to a M-th cladding sub-layer provided on the active layer in this order, whereas said M is an integer not less than 2. The first upper cladding sub-layer has an energy band gap larger than that of the M-th upper cladding sub-layer and each of energy band gaps of the upper cladding sub-layers is larger that of the active layer. The light emitting semiconductor device further comprises a selective diffusion region and a patterned layer. In the selective diffusion region, the second conductive type impurity is diffused through a diffusion window, or an opening window, formed in a diffusion barrier film, or dielectric layer, with the diffusion front reaching to the active layer. The selective diffusion region is formed in the contact, upper cladding, and active layers. The patterned layer is provided on the upper cladding layer or the diffused region, or on both the upper cladding layer and the diffused region, and has an etched region at the pn-junction area in the contact layer such that at least a part of the upper cladding layer or at least a part of the diffused region is exposed.

DESCRIPTION OF THE PREFERRED EMBODIMENTS (First Embodiment)

The below-mentioned description is applicable to a discrete LED device as well as an LED array.

Figure 1:
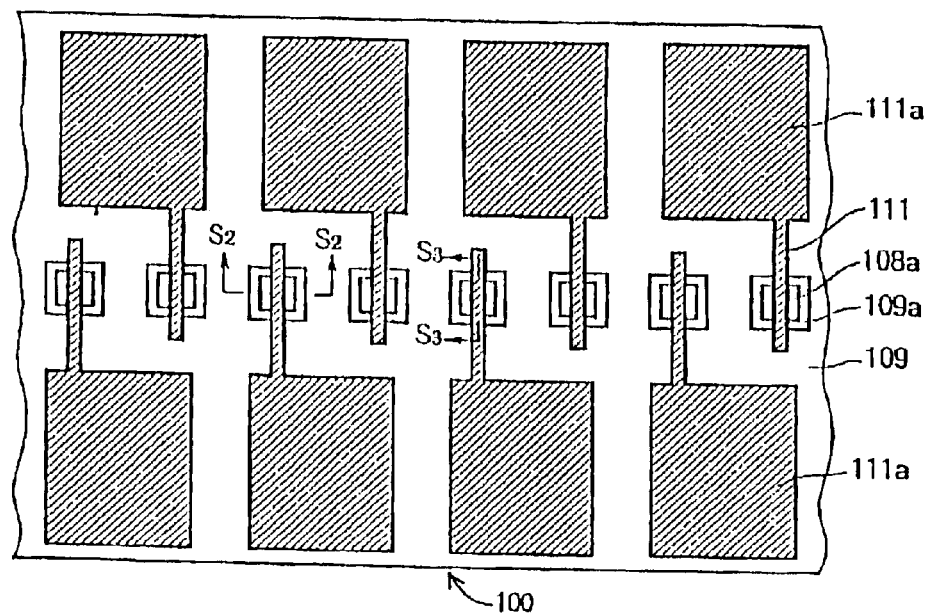
FIG. 1 a top plan view of a part of an LED array according to the first embodiment of the invention.

In FIG. 1, the LED array 100 comprises an epitaxial wafer (formed of a semiconductor substrate and a semiconductor epitaxial layer grown on the semiconductor substrate), a plurality of light emitting sections 108a formed in the epitaxial wafer (second conductive type semiconductor regions 108), a plurality of second conductive side electrode layers 111 connected to the light emitting section 108a (discrete electrodes 111), and a plurality of electrode pads 111a connected to the discrete electrodes 111. Shapes and layouts of the Light emitting sections 108a, discrete electrodes 111, and electrode pads 111a are not limited to those illustrated in the drawings.

Figure 2:
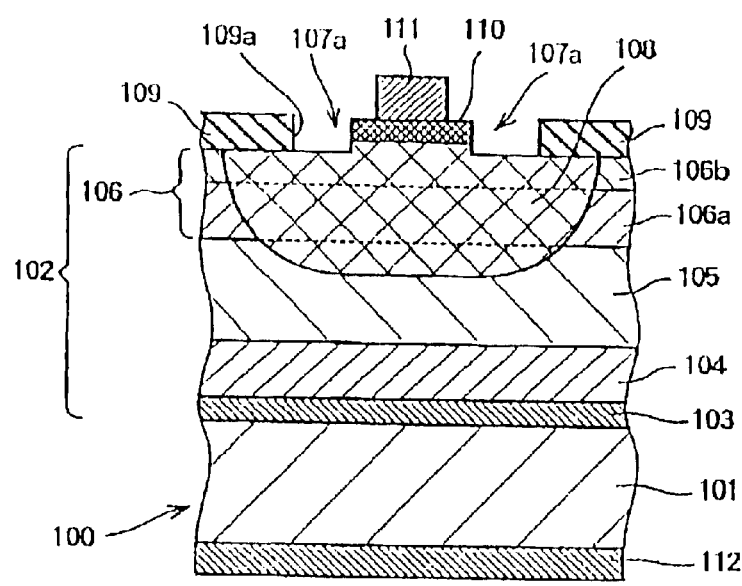
FIG. 2 is a sectional view taken along line $S_2$—$S_2$ of FIG. 1.
Figure 3:
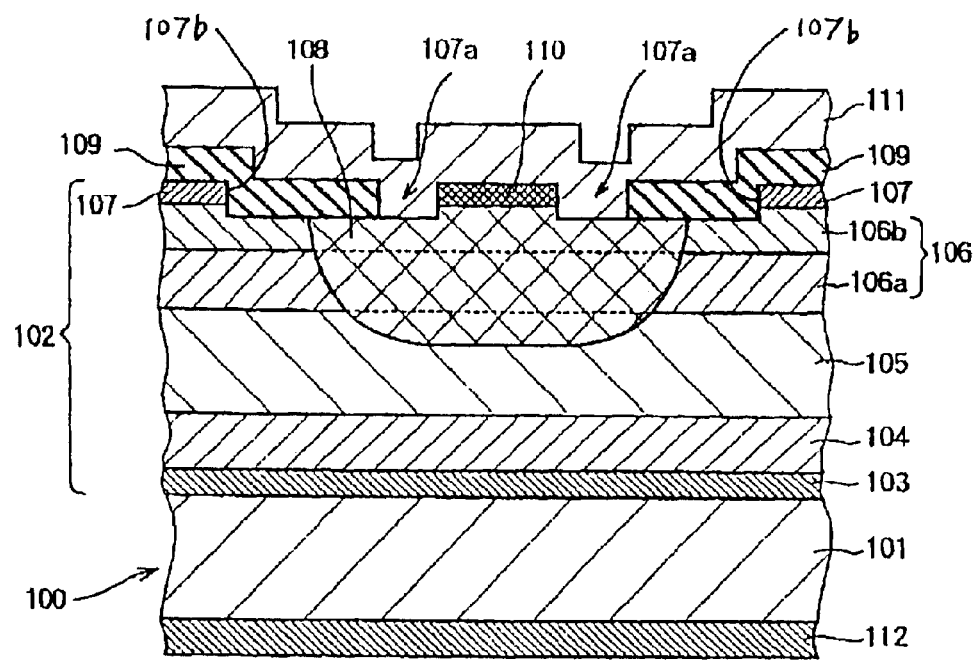
FIG. 3 is a sectional view taken along line $S_3$—$S_3$ of FIG. 1.

As shown in FIGS. 2 and 3, the epitaxial wafer includes the structure consisting of a semiconductor epitaxial layer 102 formed on a semiconductor substrate 101 of the first conductive type. The semiconductor epitaxial layer 102 comprises a buffer layer 103 of the first conductive type formed on the semiconductor substrate 101, a lower cladding layer 104 of the first conductive type formed on the buffer layer 103, an active layer 105 of the first conductive type formed on the lower cladding layer 104, a upper cladding layer 106 of the first conductive type formed on the active layer 105, a second conductive type region 108 formed by selective impurity diffusion, and a contact layer 107 of the first conductive type formed on the upper cladding layer 106 and brought into ohmic contact with the electrode layer (surface of the second conductive type contact layer 110).

The upper cladding layer 106 comprises a first upper cladding layer 106a formed on the active layer 105 and a second upper cladding layer 106b formed on the first upper cladding layer 106a. In the first embodiment, the first conductive type is an n-type and the second conductive type is a p-type.

The semiconductor substrate 101 is made of, for example, n-type GaAs and the buffer layer 103 is made of, for example, n-type GaAs. The lower cladding layer 104 is made of, for example, n-type $Al_{z2}Ga_{1-x}As$ and the active layer 105 is made of, for example, n-type $Al_yGa_{1-y}As$. The first upper cladding layer 106a is made of, for example, n-type $Al_{z1}Ga_{1-z1}As$, the second upper cladding layer 106b is made of, for example, n-type $Al_{z2}Ga_{1-z2}As$, and the first conductive type contact layer 107 is made of, for example, n-type GaAs. The symbols x, y, z1, and z2 meet the formulas, $0<x\leq1$, $0\leq y<1$, $0<Z1<1$, $0<z2\leq1$, $X>y$, and $Z1>z2>y$. $Z1>x$ is also acceptable.

The first conductive type impurity is, for example, silicon (Si). Each semiconductor epitaxial layer is formed by the metal organic chemical vapor deposition (MOCVD) method.

In FIGS. 2 and 3, the second conductive type semiconductor region 108 is a region that is formed by diffusing an impurity of the second conductive type through an area predetermined by a diffusion window (opening window) formed in a diffusion barrier film (dielectric layer) from the surface of the semiconductor epitaxial layer 102 (an area above the region 108). The region 108 is formed so that it reaches at least the active layer 105. A plurality of the regions 108 are formed in the LED array 100 (only one is shown in FIGS. 2 and 3).

The first conductive type contact layer 107 is formed on the second upper cladding layer 106b such that it dose not have electrical contact to the region 108. The second conductive impurity is, for example, Zinc (Zn).

In FIGS. 2 and 3, the LED array 100 comprises an dielectric interlayer 109 covering at least a part of the first conductive type contact layer 107 and a part of the exposed upper cladding layer 106 in the contact layer window 107b, on which an discrete electrode 111 is formed, a contact layer 110 of the second conductive type formed on the second conductive type semiconductor region 108, and the discrete electrode 111 formed on the dielectric interlayer 109 and the second conductive type contact layer 110.

The LED array 100 comprises a first conductive side electrode layer 112 (common electrode 112) formed under the substrate 101. In FIG. 2, the second conductive type contact layer 110 is electrically isolated from the first conductive type contact layer 107 by an etched region 107a. The etched region 107a includes the pn-junction interface formed in the contact layer. The second conductive type contact layer 110 is formed by doping a second conductive type impurity, such as an impurity of Zinc (Zn).

In the first embodiment, the first upper clad, second upper clad, and active layers 106a, 106b, and 105 are formed such that the following formula is met:

$$Eg(106a)>Eg(106b)>Eg(105) \qquad (1)$$

In which Eg(106a), Eg(106b), and Eg(105) represent energy band gaps of the first upper clad, second upper clad, and active layers, respectively. The formula (1) can be met by adjusting the Al content of each layer.

When the lower cladding layer 104, active layer 105, first upper cladding layer 106a, and second upper cladding layer 106b are made of $Al_xGa_{1-x}As$ ($0<x<1$), $Al_yGa_{1-y}As$ ($0\leq y<1$), $Al_{z1}Ga_{1-z1}As$ ($0<Z1<1$), and $Al_{z2}Ga_{1-z2}As$ ($0<z2<1$), respectively, the respective layers are formed such that $X>y$, and $Z1>z2>y$ to meet the formula (1).

An example of the contents for the LED array 100 according to the first embodiment is x=0.6, y=0.15, z1=0.6, and z2=0.4. Another example is x=0.2, y=0.15, z1=0.6, and z2=0.4. However, the contents of the respective layers are not limited to the above examples.

Figure 4:
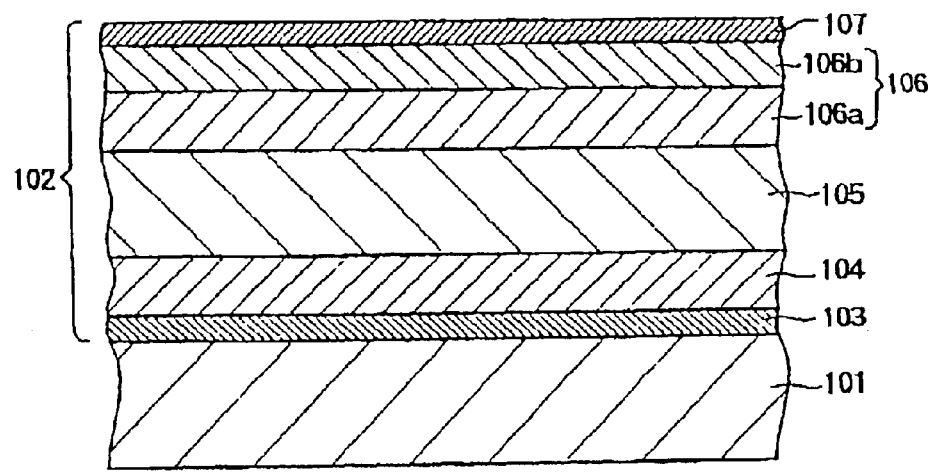
FIGS. 4–7 are sectional views of the LED array according to the first embodiment, showing a manufacturing method therefor.

In FIG. 4, the buffer layer 103, lower cladding layer 104, active layer 105, first upper cladding layer 106a, second upper cladding layer 106b, and contact layer 107 are formed in this order on the first conductive type substrate 101 such that the content of the respective layers are adjusted to meet the formula (1), wherein all layers are the first conductive type.

Figure 5:
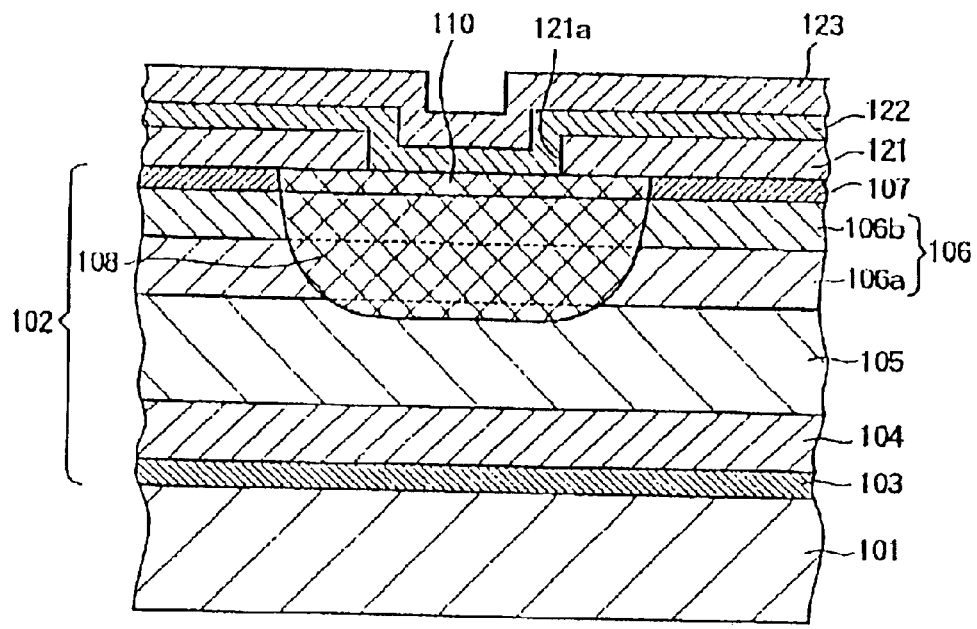

In FIG. 5, a dielectric layer 121 is formed on the contact layer 107 and an opening window 121a is formed in the dielectric layer 121 by photolithography technology. Then, a diffusion source film 122 including Zn and an annealing cap film 123 are formed so that the second conductive type semiconductor region 108 is formed by solid-phase diffusing the second conductive type impurity (Zn) into the active layer 105 and upper cladding layer 106 through the opening window 121a. A part of the first conductive type contact layer 107 is changed to the second conductive type contact layer 110 by this impurity diffusioin process.

Figure 6:
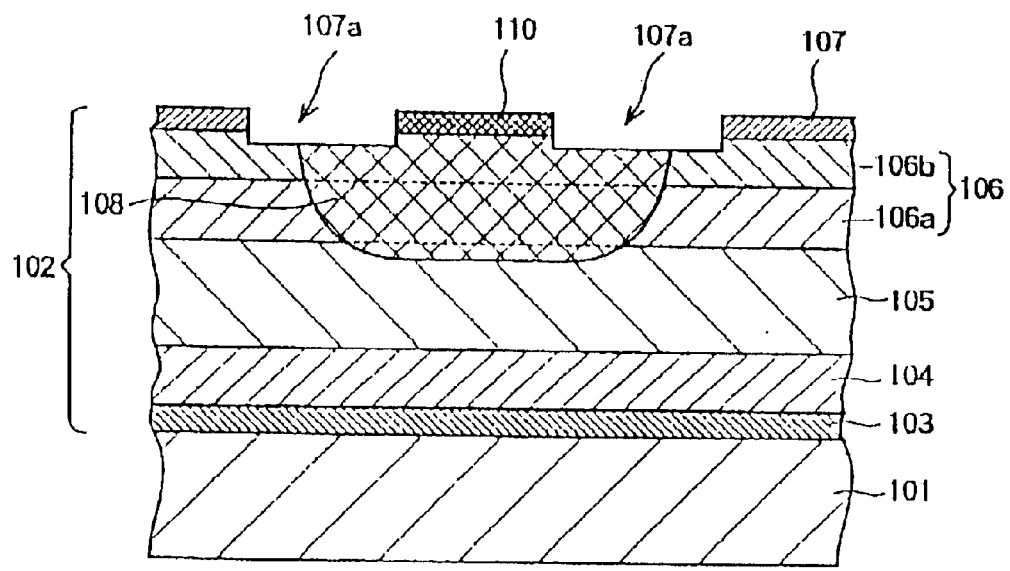

Then, the annealing cap film 123, diffusion source layer 122, and a part of the dielectric film 121 to expose at least the surface of the contact layer at the pn-junction interface are removed. In FIG. 6, a periphery of the second conductive type contact layer 110 (a region including the pn-junction interface in the contact layer formed by the impurity diffusion process) and an uppermost part of the second upper cladding layer 106b that includes the pn-junction interface are removed by photolithography followed by etching to form the etched region 107a. A solution consisting of phosphor acid, hydrogen peroxide, and diluted water, for example, is used as an etchant because etching control is easy. By this process, the second conductive type contact layer 110 is electrically isolated from the first conductive type contact layer 107 by the etched region 107a.

Figure 7:
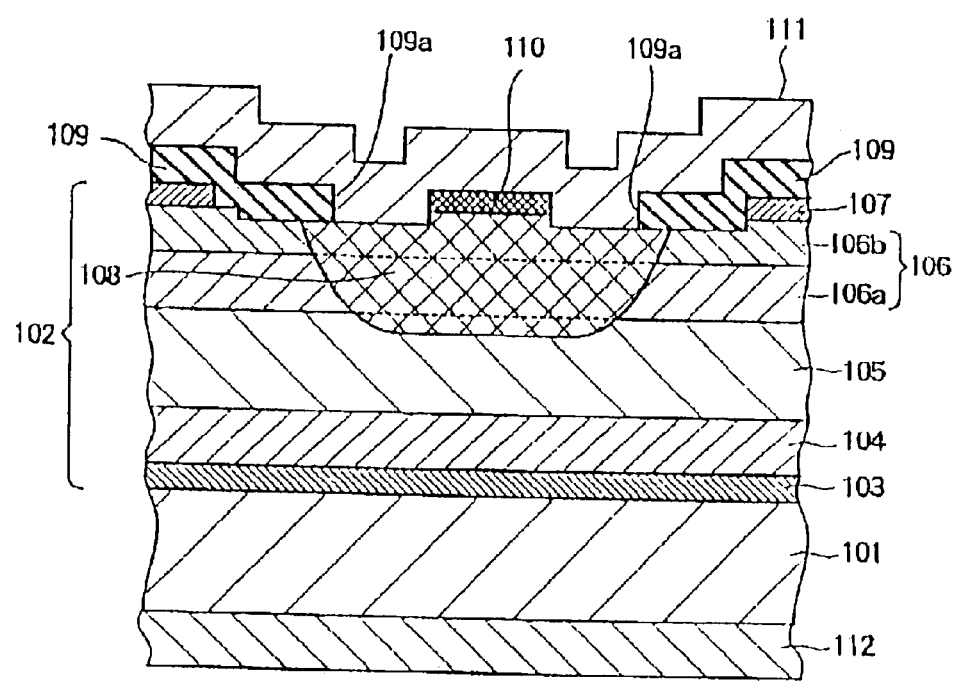

In FIG. 7, the dielectric interlayer 109 is formed on the first conductive type contact layers 107, on the first and second conductive type second upper cladding layer 106b including the exposed pn-junction interface. An opening window 109a is formed in the dielectric interlayer 109 in the periphery of the second conductive type contact layer 110 by photolithography so that the surfaces of the second conductive type contact layer 110 and a part of the second upper cladding layer 106b are exposed. Otherwise, if desired, the opening window 109a may be formed on the second upper cladding layer 106b and a part of the contact layer 110 so that the remaining part of the contact layer 110 is exposed.

Then, the discrete electrode 111 electrically connected to the second conductive type contact layer 110 is formed by photolithography after forming a film made of an Al-group metal by EB deposition. Hot phosphoric acid, for example, is used as an etchant because etching control for Al-group metal is easy.

After forming the first conductive type contact, second conductive type contact, dielectric interlayer 107, 110, and 109, and the discrete electrode 111 on the second upper cladding layer 106b, the common electrode 112 is formed on the back surface of the substrate 101 to complete the LED array 100.

According to the first embodiment of the invention, while the Al content of the first upper cladding layer 106a is made sufficiently high to obtain high light-output efficiency, the Al content of the second upper cladding layer 106b is made much lower than that of the first upper cladding layer 106a. Accordingly, the exposed surface of the second upper cladding layer 106b is not made rough by the hot phosphoric acid used in the etching for patterning the contact layer 107, thus effecting no or little adverse influence on the light emitting characteristics of the LED section.

Figure 15:
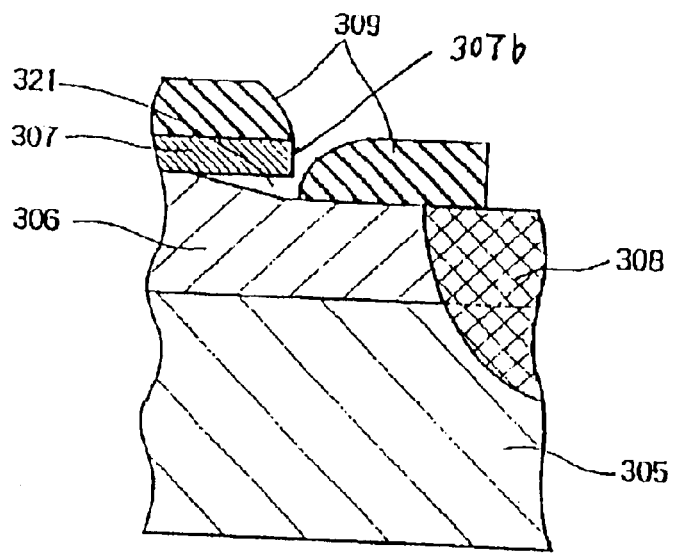
FIG. 15 is an enlarged view of an A1 section of FIG. 14.
Figure 16:
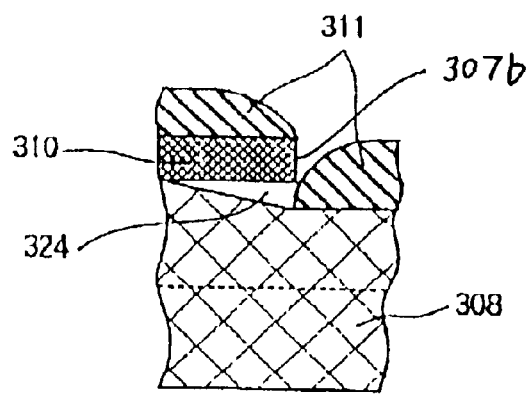
FIG. 16 is an enlarged view of an A2 section of FIG. 14.

In addition, since there is no excessive etching extending from the exposed surface to the periphery in lateral direction thereof, any gap space such as shown in FIG. 15 or 16 does not appear. Experiments showed that when the second upper cladding layer 106b ($Al_{z2}Ga_{1-z2}As$) is formed in the range of $z2 \leq 0.45$, the exposed surface of the second upper cladding layer 106b is not eroded by the etching for patterning the contact layer 107.

As described above, according to the first embodiment, the upper cladding layer 106 is formed of the first cladding layer 106a and the second cladding layer 106b formed on the active layer 105 in this order. Also, the energy band gap of the first upper cladding layer 106a is larger that that of the second upper cladding layer 106b and the energy band gap of the second upper cladding layer 106b is larger than that of the active layer 105 are larger.

Since the energy band gap of the first upper cladding layer 106a provided on the side of the active layer 105 can be large without taking into account an influence of the etching process for the etched region 107a on the surface of the upper cladding layer, the difference of the energy band gaps between the active layer 105 and the upper cladding layer 106 is made large enough so that injected minority carriers are efficiently confined inside the active layer 105 and the light emitting efficiency increases.

Since the second upper cladding layer 106b having a relatively small energy band gap forms the upper surface of the upper cladding layer 106, the surface of the second upper cladding layer 106b is not prone to be eroded by the etchant used in the wet-etching process for forming the patterned layer provided thereon, such as the contact layers 106 and 110, dielectric interlayer 109, and the discrete electrode 111. Consequently, the defect in the dielectric interlayer (insulation defect) illustrated in FIG. 15 and the defect in the electrode layer (disconnection) illustrated in FIG. 16 are prevented, thereby to increase the reliability of the device.

In the first embodiment, the energy band gap of the second upper cladding layer 106b is smaller than that of the first upper cladding layer 106a so that the concentration of Zn in the second upper cladding layer 106b is made higher than that in the first upper cladding layer 106a. Accordingly, it is possible to make high the density of holes (the concentration of activated Zn which is contributable to electrical characteristics) in the second conductive type semiconductor region 108 (the region of Zn diffusion). Consequently, it is possible to decrease the voltage drop in the first upper cladding layer 106 and improve the uniformity of the light emitting strength.

The upper cladding layer 106 may be formed by stacking three or more layers instead of the two layers 106a and 106b. For example, when the upper cladding layer 106 is formed of M layers (M is an integer not less than two) including the first upper cladding layer ($Al_{z1}Ga_{1-z1}As$) to an M-th upper cladding layer ($Al_{zM}Ga_{1-zM}As$) formed on the active layer 105 ($Al_yGa_{1-y}As$) in this order, the respective layers are formed such that each of z1 to zM is larger than y, and $z1 > z2 > \ldots > zM$ are met. Also, $z1 > z2 > y$, $z1 > z3 > y$, $z1 > z4 > y$, ... and $z1 > zM > y$ are acceptable (the relation between any figures including z2 to zM can be set arbitrarily).

The lower cladding layer 104 may be formed by stacking two or more layers instead of one layer. For example, when the lower cladding layer 104 is formed of L layers (L is an integer not less than one) including the first lower cladding layer ($Al_{x1}Ga_{1-x1}As$) to an L-th lower cladding layer ($Al_{xL}Ga_{1-xL}As$) formed under the active layer 105 ($Al_yGa_{1-y}As$) in this order, it is desirable to form the respective layers such that the formulas, $X1 > y$ and $x1 > x2 > \ldots > xL$ are met to make the energy band gap of the first lower cladding layer ($Al_{x1}Ga_{1-x1}As$) larger the that of the active layer 105, wherein $Z1 > x1$ is also acceptable. Also, $x1 > z2$, and $xL > y$ are acceptable (the relation between any figures including x2 to xL can be set arbitrarily).

The semiconductor epitaxial layer 102 may be made of any composition other than AlGaAs, such as GaInAs, AlGaAsP, or AlGaInP.

(Second Embodiment)

The below-mentioned description is applicable to a discrete LED device as well as an LED array.

Figure 8:
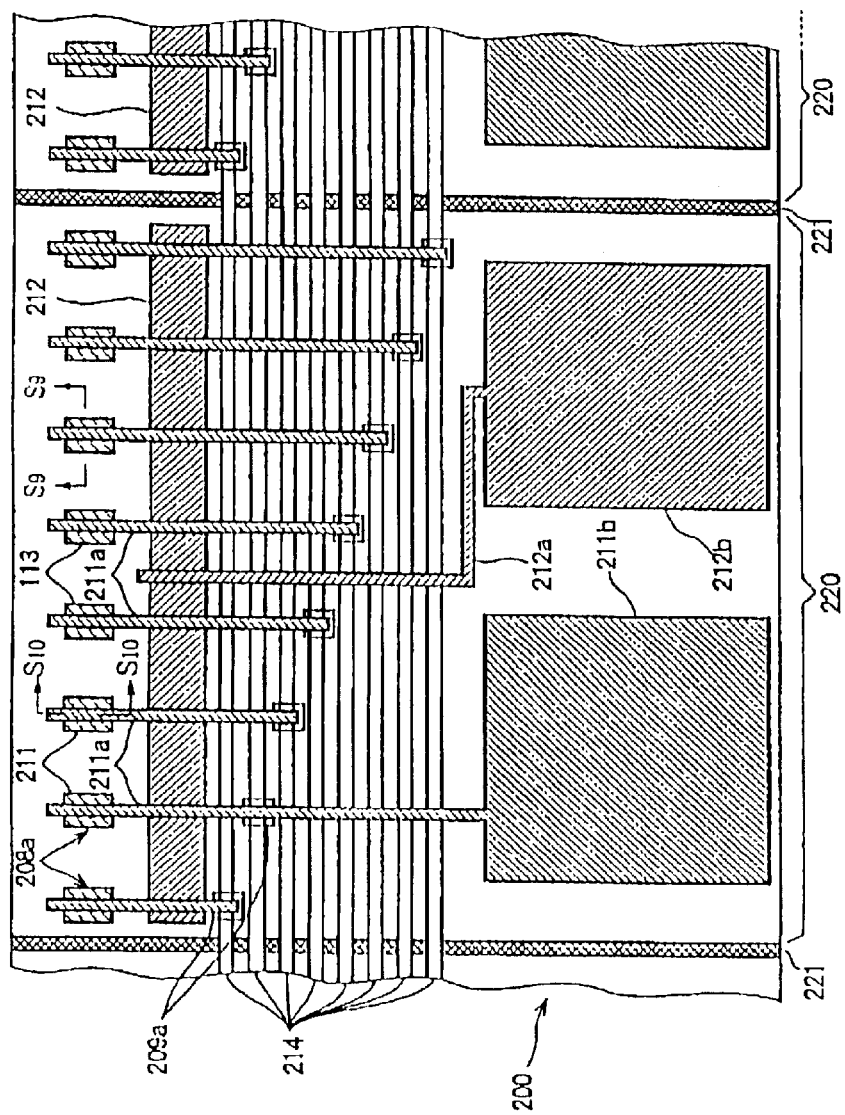
FIG. 8 a top plan view of a part of an LED array according to the second embodiment of the invention.

In FIG. 8, the LED array 200 comprises a plurality of blocks 220 isolated from each other by element separation regions 221, which is formed by diffusing a second conductive type impurity into a predetermined area of the semiconductor epitaxial layer on the substrate, or by making a groove in the semiconductor epitaxial layer by etching. Each block 220 comprises a plurality (eight in FIG. 8) of light emitting portions 208a (second conductive type semiconductor region 208). It further comprises a first conductive side electrode 212 (common electrode 212), a electrode wire 212a connected to the common electrode 212, and a electrode pad 212b for wire bonding connected to the electrode wire 212a.

The LED array 200 comprises a plurality (eight in FIG. 8) of common electrodes 214 commonly used for a plurality of blocks 220, a plurality of a second conductive side electrode wires 211a connected to the light emitting portions 208a and the common electrodes 214, and a plurality of electrode pads 211b. In this figure, dielectric interlayers 209 are not shown but a plurality of opening windows 209a of the dielectric interlayer 209 for connecting the common electrodes 214 and the electrode wires 211a are shown.

Figure 9:
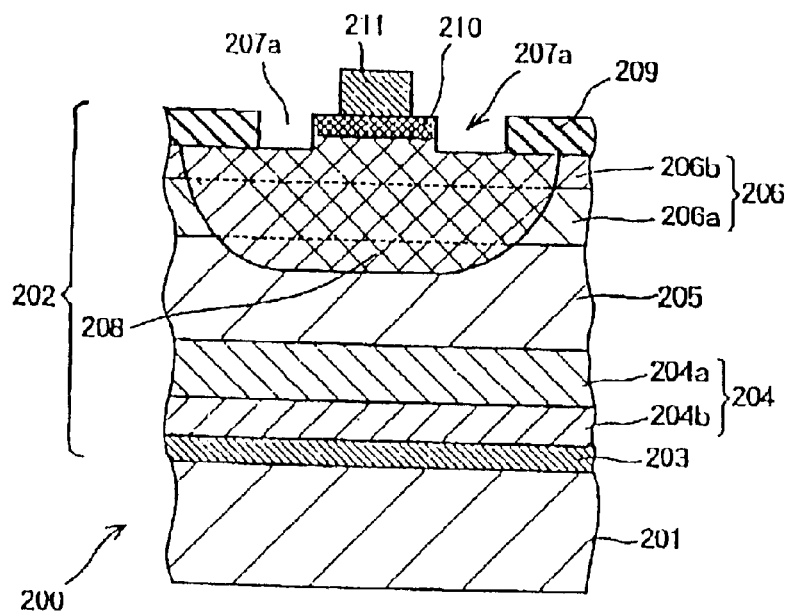
FIG. 9 is a sectional view taken along line S₉—S₉ of FIG. 8.
Figure 10:
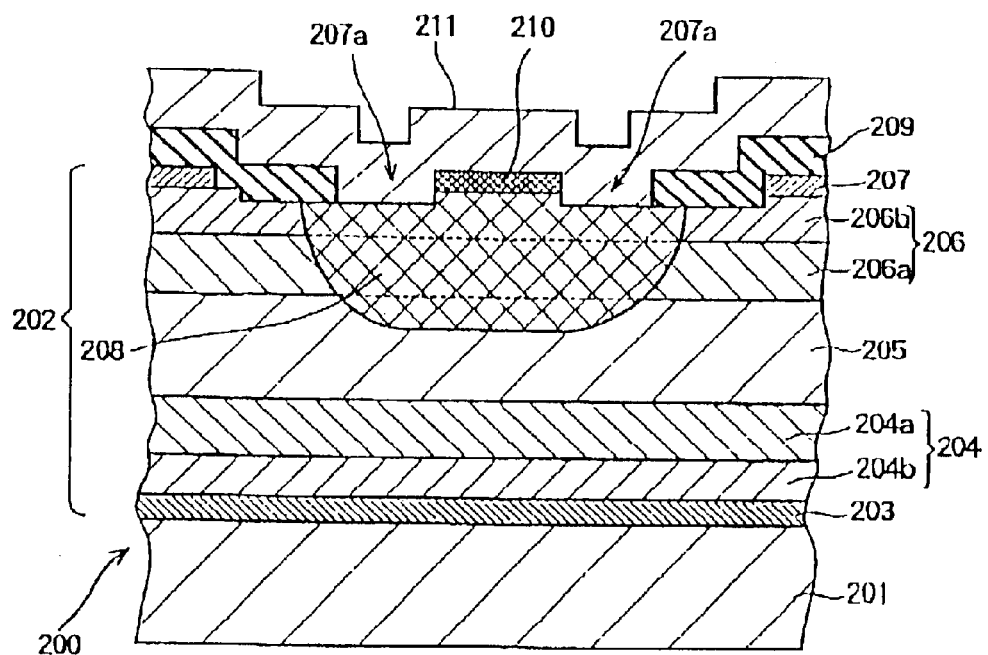
FIG. 10 is a sectional view taken along line S₁₀—S₁₀ of FIG. 8.

In FIGS. 9 and 10, the epitaxial wafer includes the structure consisting of a semiconductor epitaxial layer 202 formed on a semiconductor substrate 201. The semiconductor epitaxial layer 202 comprises a buffer layer 203 formed on the semiconductor substrate 201, a first conductive type lower cladding layer 204 formed on the buffer layer 203, a first conductive type active layer 205 formed on the lower cladding layer 204, a first conductive type upper cladding layer 206 formed on the active layer 205, and a first conductive type contact layer 207 formed on the upper cladding layer 206 and brought into ohmic contact with the electrode layer.

The upper cladding layer 206 comprises a first upper cladding layer 206a formed on the active layer 205 and a second upper cladding layer 206b formed on the first upper cladding layer 206a. The lower cladding layer 204 comprises a first lower cladding layer 204a formed under the active layer 205 and a second lower cladding layer 204b formed under the first lower cladding layer 204a. In the second embodiment, the first conductive type is an n-type and the second conductive type is a p-type.

The semiconductor substrate 201 is made of, for example, semi-insulative GaAs and the buffer layer 203 is made of, for example, semi-insulative GaAs. The first lower cladding layer 204a is made of, for example, n-type $Al_{x1}Ga_{1-x1}As$, the second lower cladding layer 204b is made of, for example, n-type $Al_{x2}Ga_{1-x2}As$. The active layer 205 is made of, for example, n-type $Al_yGa_{1-y}As$. The first upper cladding layer 206a is made of, for example, n-type $Al_{z1}Ga_{1-z1}As$, the second upper cladding layer 206b is made of, for example, n-type $Al_{x2}Ga_{1-x2}As$, and the first conductive type contact layer 207 is made of, for example, n-type GaAs. The symbols x1, x2, y, z1, and z2 meet formulas, $0<x1\leq1$, $0<x2\leq1$, $0\leq y<1$, $0<Z1\leq1$, $0<z2<1$, X1>y, x1>x2, and Z1>z2>y. Z1>x1 and x2>x1 is also acceptable. A first conductive type impurity is, for example, silicon (Si). Each semiconductor epitaxial layer is formed by the metal organic chemical vapor deposition (MOCVD) method.

The second conductive type semiconductor region 208 is a region that is formed by diffusing a second conductive type impurity from a predetermined area of the surface of the semiconductor epitaxial layer 202 (an area above the region 208). The region 208 is formed such that the diffusion front reaches at least the active layer 205. A plurality of regions 208 are formed in the LED array 200 (only one is shown in FIGS. 9 and 10). The first conductive type contact layer 207 is formed on the second upper cladding layer 206b such that it dose not electrically contact to the region 208. The second conductive impurity is, for example, Zinc (Zn).

The LED array 200 comprises an dielectric interlayer 209 covering the first conductive type contact layer 207 and the second upper cladding layer 206b, a second conductive type contact layer 210 formed on the second conductive type semiconductor region 208, a discrete electrode 211 formed on the dielectric interlayer 209 and the second conductive type contact layer 210, and the first conductive type electrode 211 (common electrode 212).

In FIG. 9, the second conductive type contact layer 210 is electrically isolated from the first conductive type contact layer 207 by an etched region 207a. The etching region 207a includes the pn-junction interface formed in the contact layer. The second conductive type contact layer 210 is formed by doping the second conductive type impurity, such as Zn.

In the second embodiment, the first upper clad, second upper clad, and active layers 206a, 206b, and 205 are formed such that the following formula is met:

$$Eg(206a) > Eg(206b) > Eg(205) \quad (2)$$

whereas, Eg(206a), Eg(206b), and Eg(205) represent energy band gaps of the first upper clad, second upper clad, and active layers, respectively. The formula (2) can be met by adjusting the content of Al of each layer.

In the second embodiment, the first lower clad, second lower clad, and active layers 204a, 204b, and 205 are formed such that the following formulas are met:

$$Eg(204a) > Eg(205) \quad (3)$$

$$Eg(204a) > Eg(204b) \quad (4)$$

wherein, Eg(204a), Eg(204b), and Eg(205) are energy band gaps of the first lower clad, second lower clad, and active layers 204a, 204b, and 205, respectively. The formulas (3) and (4) can be met by adjusting the content of Al of each layer.

When the second lower cladding layer 204b, the first lower cladding layer 204a, the active layer 205, the first upper cladding layer 206a, and the second upper cladding layer 206b are made of $Al_{x2}Ga_{1-x2}As$ ($0<x2\leq1$), $Al_{x1}Ga_{1-x1}As$ ($0<x1\leq1$), $Al_yGa_{1-y}As$ ($0\leq y<1$), $Al_{z1}Ga_{1-z1}As$ ($0<Z1\leq1$), and $Al_{z2}Ga_{1-z2}As$ ($0<z2<1$), respectively, the respective layers are formed to meet X1>y, x1>x2, and Z1>z2>y, which in turn meets the formulas (2)–(4), wherein z1>x1 is desirable. X2>x1 is also acceptable.

An example of the content of the LED array 200 according to the second embodiment is x2=0.2, x1=0.4, y=0.25, z1=0.6, and z2=0.4. Another example is x=0.2, y=0.15, z1=0.6, and z2=0.4. However, the Al contents of the respective layers are not limited to the above example. For the manufacturing of the LED array 200 according to the second embodiment, the same process illustrated in FIGS. 4–7 can be applied except number of layers forming the lower cladding layer 204, and the location and shape of the electrode.

According to the second embodiment, the same effect as that of the first embodiment is obtained. The lower cladding layer 204 is formed of the first and second cladding layers 204a and 204b. Accordingly, since the difference in the energy band gaps between the buffer layer 203 and the lower cladding layer 204 is made smaller than that of the lower cladding layer formed of a single layer, the defective ratio in the manufacturing process is reduced and the reliability of the light emitting devices is increased.

The upper cladding layer 206 may be formed of three or more layers instead of the two layers 206a and 206b. For example, when the upper cladding layer 206 is formed of M layers (M is an integer not less than two) including the first upper cladding layer ($Al_{z1}Ga_{1-z1}As$) to an M-th upper cladding layer ($Al_{zM}Ga_{1-zM}As$) formed on the active layer 205 ($Al_yGa_{1-y}As$) in this order, the respective layers are formed such that each of z1 to zM is larger than y, and z1>z2> . . . >zM. Also, z1>z2, and zM>y are acceptable (the relationship between any symbols including z2 to zM can be set arbitrarily).

The lower cladding layer 204 may be formed of three or more layers instead of two layers. For example, when the lower cladding layer 204 is formed of L layers (L is an integer not less than one) including the first lower cladding layer ($Al_{x1}Ga_{1-x1}As$) to an L-th lower cladding layer ($Al_{xL}Ga_{1-xL}As$) formed under the active layer 205 ($Al_yGa_{1-y}As$) in this order, it is desirable that the respective layers are formed such that X1>y, and x1>x2> . . . >xL are met to make the energy band gap of the first lower cladding layer ($Al_{x1}Ga_{1-x1}As$) larger than that of the active layer 205.

Figure 11:
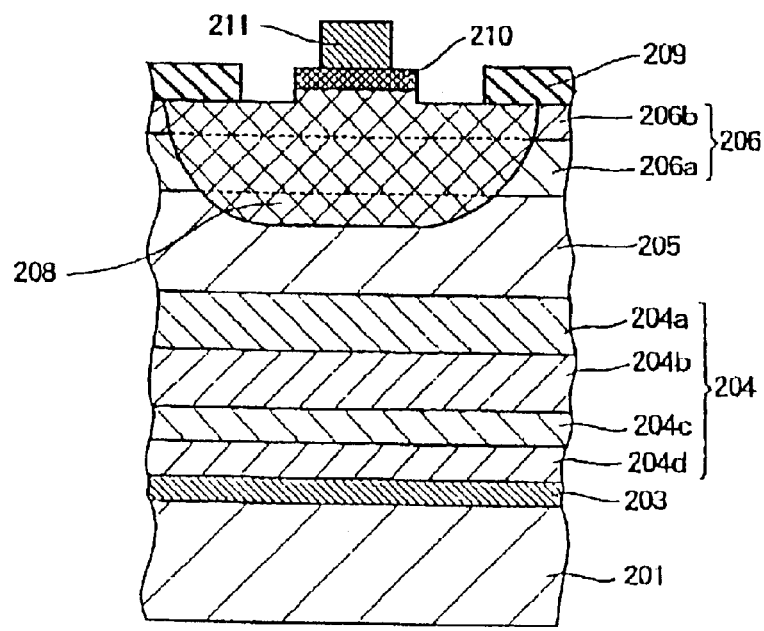
FIG. 11 is a sectional view of the first variation of the LED array according to the second embodiment.

FIG. 11 shows the lower cladding layer 204 having four layers, 204a–204d (variation 1). The semiconductor epitaxial layer 202 may be made of any composition other than AlGaAs, such as GaInAsP, AlGaAsP, or AlGaInP.

Figure 12:
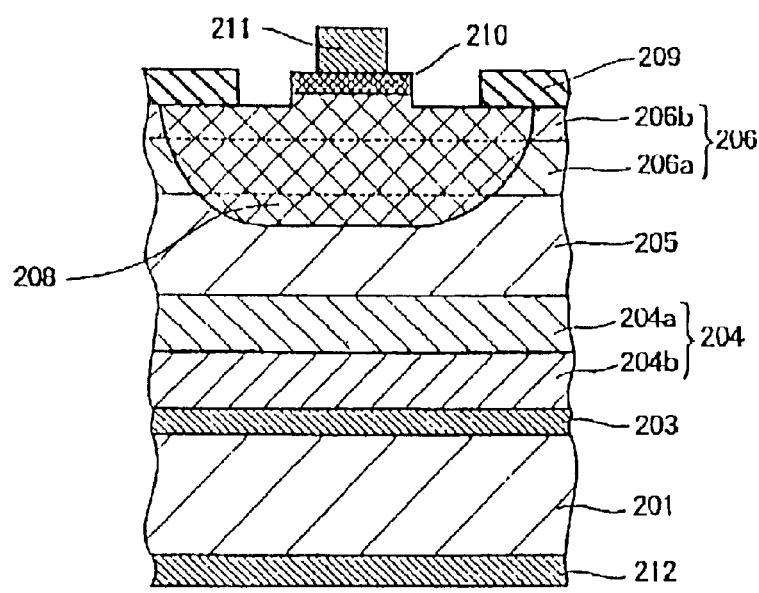
FIG. 12 is a sectional view of the second variation of the LED array according to the second embodiment.

FIG. 12 shows the common electrode 212 formed under the semiconductor substrate 201 (variation 2).

Figure 13:
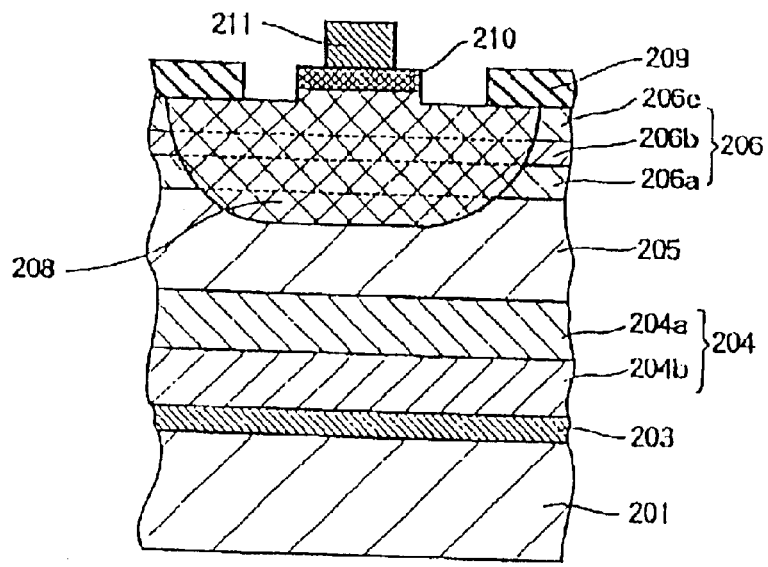
FIG. 13 is a sectional view of the third variation of the LED array according to the second embodiment.
Figure 14:
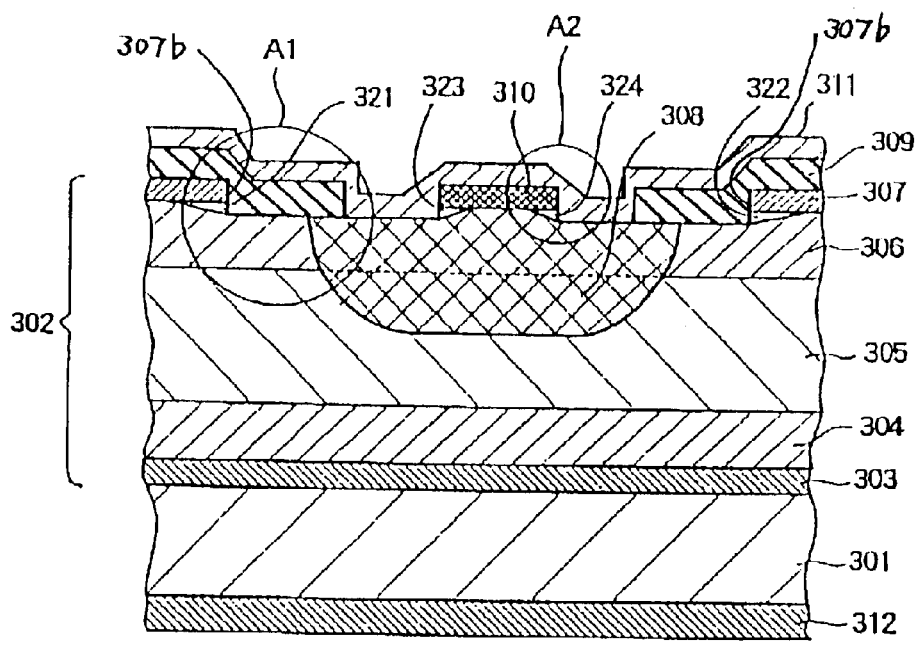
FIG. 14 is a sectional view of a part of a conventional LED array.

FIG. 13 shows the upper cladding layer 206 formed of the first, second, third upper cladding layers 206a, 206b, and 206c (variation 3). The Al contents of the first, second, and third upper cladding layers 206a, 206b, and 206c are, for example, $Al_{0.6}Ga_{0.4}As$, $Al_{0.5}Ga_{0.5}As$, and $Al_{0.4}Ga_{0.6}As$, respectively.

As described above, according to the invention, the upper cladding layer is composed of the first, second, . . . and M-th cladding layers formed on the active layer in this order (M is an integer not less than two). Also, these layers are formed such that the energy band gap of the first upper cladding layer is larger than the energy band gaps of the M-th upper cladding layer and the active layer. Thus, by making the energy band gap of the first upper cladding layer provided next to the active layer relatively high, the difference in the energy band gap between the active layer and the upper cladding layer becomes large so that injected minority carriers are efficiently confined in the active layer, thus increasing the light emitting efficiency.

Since the M-th upper cladding layer having a relatively small energy band gap, or a relatively small content of Al, forms the uppermost surface of the upper cladding layer, the surface of the M-th upper cladding layer is not prone to be eroded by the etchant used in etching process for forming the patterned layer provided thereon. Consequently, the defect in the dielectric interlayer (insulation defect) and the defect in the electrode wire layer (disconnection) are prevented.

Since the content of material of the lower cladding layer (for example, the content of Al in AlGaAs) is closer to the content of the active layer than the content of material of the upper cladding layer (for example, the content of Al in AlGaAs), the defect in the epitaxial layer caused by the difference in the Al contents of the materials in forming the epitaxial layer on the substrate is prevented, thus minimizing the deterioration of the luminous energy characteristics.

What is claimed is:

1. A light emitting semiconductor device, comprising:
   a substrate;
   a first semiconductor layer made of a first conductive type semiconductor epitaxial layer provided on said substrate;
   an upper layer made of said first conductive type semiconductor epitaxial layer and including a second semiconductor layer and a third semiconductor layer provided on said first semiconductor layer in this order, wherein each of energy band gaps of said second and third layers is larger than that of said first semiconductor layer, and said energy band gap of said second layer is larger than that of said third semiconductor layer; and
   an impurity diffused region made by diffusing a second conductive type impurity through said upper layer and in a part of said first semiconductor layer.

2. The light emitting semiconductor device according to claim 1, which further comprises a patterned layer provided on at least one of said upper layer and said diffused region and having an etched region at a predetermined area thereof such that at least a part of said upper layer or at least a part of said diffused region is exposed, wherein said patterned layer selectively comprises:
   a first conductive type contact layer provided on said upper layer;
   a second conductive type contact layer provided on said diffused region;
   a dielectric interlayer covering said first conductive type contact layer; and
   a second conductive side electrode formed on said upper layer and said dielectric interlayer.

3. The light emitting semiconductor device according to claim 2, which further comprises:
   a buffer layer provided on said substrate; and
   a lower cladding layer made of said first conductive type epitaxial layer and provided between said buffer layer and said first semiconductor layer.

4. The light emitting semiconductor device according to claim 1, which further comprises:
   a buffer layer provided on said substrate; and
   a lower cladding layer made of said first conductive type epitaxial layer and provided between said buffer layer and said first semiconductor layer.

5. The light emitting semiconductor device according to claim 4, wherein said lower cladding layer comprises a plurality of lower cladding sub-layers including a first lower cladding sub-layer to an L-th lower cladding sub-layer provided under said first semiconductor layer in this order, wherein said L is an integer not less than 1, said first lower cladding sub-layer has an energy band gap larger than that of said first semiconductor layer, and when said L is not less than 2, said energy band gap of said first lower cladding sub-layer is larger than that of L-th lower cladding sub-layer.

6. The light emitting semiconductor device according to claim 5, wherein one of said lower cladding sub-layers has an energy band gap larger than that of other lower cladding sub-layers, which are provided farther from said first semiconductor layer than said one lower cladding sub-layer.

7. The light emitting semiconductor device according to according to claim 5, wherein said energy band gap of said first lower cladding sub-layer is smaller than that of said second semiconductor layer.

8. The light emitting semiconductor device according to claim 5, wherein said first to L-th lower cladding sub-layers are made of $Al_{x1}Ga_{1-x1}As$ to $Al_{xL}Ga_{1-xL}As$, respectively, said first semiconductor layer is made of $Al_yGa_{1-y}As$, and said second and third semiconductor layers are made of $Al_{z1}Ga_{1-z1}As$ to $Al_{z2}Ga_{1-z2}As$, respectively, wherein each of said x1 to xL, y, and z1 to z2 is larger than 0 and smaller than 1, and said $x1$ is larger than said $y$, each of said $z1$ and said $z2$ is larger than said $y$, said $x1$ is larger than said $xL$, and said $z1$ is larger than said $z2$.

9. The light emitting semiconductor device according to claim 8, wherein said $x1, x2 \ldots xL, z1,$ and $z2$ meet $x1 > x2 > \ldots \leq xL$ and $z1 \leq z2$.

10. The light emitting semiconductor device according to claim 8, wherein said $z1$ and $x1$ are $z1 > x1$.

11. The light emitting semiconductor device according to claim 8, wherein said $L, x1, y, z1,$ and $z2$ are $L=1, x1=0.6, y=0.15, z1=0.6,$ and $z2=0.4$, respectively.

12. The light emitting semiconductor device according to claim 8, wherein said $L, x1, y, z1,$ and $z2$ are $L=1, x1=0.2, y=0.15, z1=0.6,$ and $z2=0.4$, respectively.

13. The light emitting semiconductor device according to claim 8, wherein said $L, x2, x1, y, z1,$ and $z2$ are $L=2, x2=0.2, x1=0.4, y=0.25, z1=0.6,$ and $z2=0.4$, respectively.

14. The light emitting semiconductor device according to claim 10, wherein said $L, x2, x1, y, z1,$ and $z2$ are $L=2, x2=0.2, x1=0.4, y=0.25, z1=0.6,$ and $z2=0.4$, respectively.

* * * * *